(12) United States Patent
Richter et al.

(10) Patent No.: US 6,773,983 B2
(45) Date of Patent: Aug. 10, 2004

(54) MEMORY CELL ARRANGEMENT AND METHOD FOR ITS FABRICATION

(75) Inventors: Frank Richter, Dresden (DE); Dietmar Temmler, Dresden (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 10/159,261

(22) Filed: May 31, 2002

(65) Prior Publication Data

US 2002/0191455 A1 Dec. 19, 2002

(30) Foreign Application Priority Data

May 31, 2001 (DE) .......................................... 101 26 604

(51) Int. Cl.[7] .......................................... H01L 21/8242
(52) U.S. Cl. .................................................. 438/243
(58) Field of Search ................................. 438/243, 242

(56) References Cited

U.S. PATENT DOCUMENTS

| | | | | |
|---|---|---|---|---|
| 5,688,713 A | * | 11/1997 | Linliu et al. ................. | 438/253 |
| 5,744,386 A | * | 4/1998 | Kenney ......................... | 438/245 |
| 5,780,332 A | * | 7/1998 | Ozaki ........................... | 438/238 |
| 5,843,819 A | * | 12/1998 | Kellner et al. .............. | 438/243 |
| 6,037,194 A | * | 3/2000 | Bronner et al. ............. | 438/147 |
| 6,063,658 A | * | 5/2000 | Horak et al. ................. | 438/248 |
| 6,130,127 A | * | 10/2000 | Yang ............................ | 438/253 |
| 6,448,610 B2 | * | 9/2002 | Weis ............................ | 257/330 |
| 6,590,249 B2 | * | 7/2003 | Küsters et al. .............. | 257/301 |

FOREIGN PATENT DOCUMENTS

DE 199 41 148 A1 4/2001

* cited by examiner

*Primary Examiner*—David Nelms
*Assistant Examiner*—Thao P. Le
(74) *Attorney, Agent, or Firm*—Laurence A. Greenberg; Werner H. Stemer; Gregory L. Mayback (57) ABSTRACT

The present invention relates to a memory cell arrangement and a fabrication method for this memory cell arrangement. In this case, the memory cells (15a, 15b, 15c) arranged regularly on a semiconductor wafer each have a trench capacitor (20a, 20b, 20c) formed in the semiconductor substrate (10), and a selection transistor (30a, 30b, 30c) formed above the trench capacitor (20a, 20b, 20c), and also a self-aligned selection transistor (30a, 30b)—memory trench contact (40a, 40b)—trench insulation (52) arrangement.

4 Claims, 8 Drawing Sheets

MEMORY CELL ARRANGEMENT AND METHOD FOR ITS FABRICATION

BACKGROUND OF THE INVENTION

Field of the Invention

The invention relates to a memory arrangement having a multiplicity of memory cells which are arranged regularly in a matrix form and each have a storage capacitor and a selection transistor, which are isolated from one another in the bit line direction by self-aligned insulation structures arranged orthogonally with respect thereto, and also a fabrication method for such a memory arrangement.

A dynamic random access memory (DRAM) contains a multiplicity of memory cells which are formed regularly in the form of a matrix on a semiconductor wafer. Each of these memory cells generally comprises a storage capacitor and a selection transistor. During a read or write operation, the storage capacitor is charged or discharged with an electric charge, corresponding to the respective data unit (bit), via the selection transistor. For this purpose, the memory cell is addressed with the aid of a bit line and a word line, which are arranged in row form and column form and generally run perpendicularly to one another.

The continuous trend for increasing the packing density of integrated circuits (ICs) especially including dynamic memory ICs, means that the substrate area available for an individual memory cell is reduced, which affects the electrically active elements of the memory cell (transistor, contacts, storage capacitance) as well as the insulation structures (field insulation). For trench memory cells, the trench diameter of the memory trench is reduced and so the capacitance of said trench is reduced as well, as a result of which the risk of read errors is increased. In the case of the insulation structures (field insulation), the insulation distance is reduced, thereby reducing the security of the insulation of adjacent elements. Both of these must be prevented by suitable measures.

One possible solution to these problems is to effect a suitable arrangement of the elements of the memory cells. In this arrangement, an epitaxial semiconductor layer is applied above the trench capacitors and the selection transistors are formed in this semiconductor layer above the respective trench capacitor. Since each of these two functional elements is advantageously arranged, stacked, in a different plane of the active silicon, the memory cell area does not have to be divided proportionally between these elements and can thus be configured minimally overall. What is difficult in the case of this arrangement, however, is the fabrication of the so-called strap contacts, the contact-connection of the two memory cell component parts, since these strap contacts within the semiconductor layer have a relatively high aspect ratio.

DE 199 41 148 A1 describes such a method for fabricating contacts between a trench capacitor and a selection transistor formed above the trench capacitor.

SUMMARY OF THE INVENTION

The object of the present invention is to provide a memory cell arrangement having memory cells in which a simple and space-saving contact-connection of selection transistor and storage capacitor, which are arranged one above the other, is ensured, and also to provide a method for fabricating such a memory cell arrangement.

This object is achieved by means of a method for fabricating a memory cell arrangement in accordance with claims and a memory cell arrangement in accordance with claims. Preferred developments are specified in the dependent claims.

According to the invention, a contact opening is formed in the semiconductor layer in the interspace between two memory cells that are adjacent in the bit line direction, which contact opening reaches as far as the inner electrodes of the respective trench capacitors and, after the fabrication of a collar insulator layer on the uncovered sidewalls of the contact opening, is filled with a conductive material in such a way that the inner electrodes of the trench capacitors are electrically conductively connected to the selection transistors arranged above them. Afterward, in the contact opening, an insulation opening is produced as far as a level below the upper edge of the storage capacitors and is filled with an insulator, as a result of which the electrically conductive layer in the contact opening is subdivided into two partial regions that are insulated from one another, so that each of the partial regions forms a strap contact which electrically connects the inner electrode of the trench capacitor to the selection transistor of the respective memory cell.

What is significantly advantageous in the case of the method according to the invention or the structure according to the invention is that the strap contacts, which are initially fabricated as one contact point, are only separated by the formation of the trench insulation in this contact point. The wider contact hole of the contact point has a significantly more favorable aspect ratio for processing than two separate contact holes, as a result of which the process complexity is reduced. Furthermore, very narrow strap contacts and strap insulations can be fabricated by the method according to the invention in comparison with the conventional methods.

Since the formation and the filling of the contact hole is effected in a self-aligned manner with respect to the word lines or the insulation encapsulations of the word lines of the two memory cells, complicated method steps can be obviated.

In accordance with an advantageous embodiment, an opening with a funnel-shaped profile is produced by anisotropic etching of a spacer layer deposited on the electrically conductive layer in the contact opening, the width of the opening decreasing with depth. In the subsequent process steps, the patterned spacer layer serves as a mask for the fabrication and filling of the insulation opening in the electrically conductive layers of the contact opening. This obviates a photolithographic mask step for fabricating and filling the insulation opening. The thickness of the spacer layer, which can be set very precisely, determines very exactly the width of the etched opening and the width of the insulation opening produced underneath. At the same time, this also enables the width of the strap contacts to be determined very precisely. In particular, however, this method enables insulation openings whose width is narrower than the minimum possible lithographic web width.

In an advantageous embodiment of the invention, a thin collar insulator layer is produced at the uncovered sidewalls of the semiconductor layer in the contact opening. This insulator layer serves as insulation of the electrically conductive layer in the contact opening with respect to the semiconductor layer. This avoids leakage currents which could discharge the trench capacitor.

In an advantageous embodiment of the invention, the thin collar insulator layer is produced in the contact opening with the aid of an insulation step. This method has the advantage that a uniform insulator layer can thus be produced very simply, this being difficult to do with the layer deposition method usually used in particular at the steep-edged sidewalls of the semiconductor layer.

BRIEF DESCRIPTION OF THE DRAWINGS

The invention is explained in more detail with reference to the accompanying drawings.

In the figures.

DESCRIPTION OF THE PREFERRED EMBODIMENT

The process sequence according to the invention is illustrated using the example of a self-aligned strap contact-trench insulation arrangement of two adjacent memory cells in a dynamic random access memory (DRAM). However, the process sequence according to the invention can also be used to form contacts between component parts that are arranged offset in other known semiconductor components.

Figure 1A:
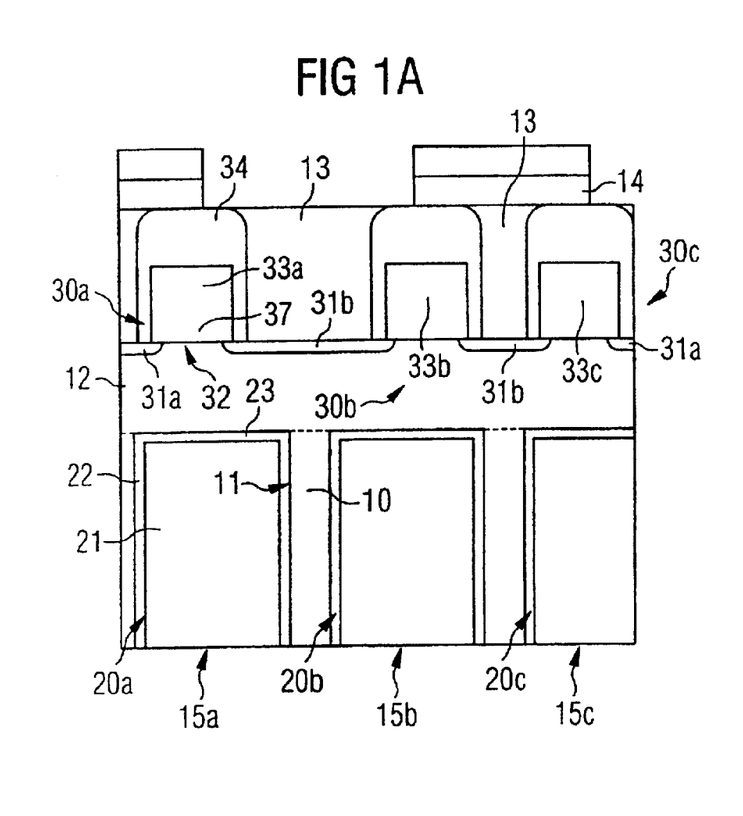
FIGS. 1A to 1L show a process sequence according to the invention for fabricating a self-aligned strap contact-trench insulation arrangement in a memory cell arrangement according to the invention.

FIGS. 1A to 1L each show a cross section through a semiconductor wafer with three memory cells 15a, 15b, 15c after different process steps, three trench capacitors 20a, 20b, 20c being formed in the semiconductor substrate 10 in the lower part of FIG. 1A. Each of these trench capacitors 20a, 20b, 20c comprises an inner electrode 21, which is formed as a trench filled with, preferably, doped polysilicon, an insulator layer 22 surrounding the trench filling 21, and an insulation covering layer 23 covering the trench filling 21. As a result of the high integration density of the memory cell arrangement, the trench capacitors 20a, 20b, 20c are arranged very close together, and they are separated from one another in the bit line direction by relatively thin webs 11 in the semiconductor substrate 10. The outer electrode of each of the trench capacitors 20a, 20b, 20c forms an electrically conductive region (not illustrated here) within the semiconductor substrate 10 which surrounds the trench capacitor 20a, 20b, 20c preferably at least in the lower region.

A semiconductor layer 12, which is preferably formed as an epitaxially grown monocrystalline silicon layer, is applied on the insulation covering layer 23 of the trench capacitors 20a, 20b, 20c. Between the rows of memory cells 15 running in the bit line direction as shown by the plan view in FIG. 3, insulation trenches 53 from previous process steps are formed within the semiconductor layer 12, which preferably extend as far as the substrate surface. These insulation trenches 53 are filled with an insulator material and form a field insulation in the word line direction between the memory cells 15.

A selection transistor 30a, 30b, 30c is respectively formed above each of the trench capacitors 20a, 20b, 20c in the semiconductor layer 12. For this purpose, electrically conductive regions 31a, 31b are formed in the upper region of the semiconductor layer 12 essentially above the webs 11 of the semiconductor substrate 10 which separate the trench capacitors 20a, 20b, 20c, said electrically conductive regions being separated by a respective channel region 32 situated essentially above the respective trench capacitor 20a, 20b, 20c.

An electrically conductive layer 37 is in turn formed above each channel region 32, which layer forms the gate electrode of the respective selection transistor 30a, 30b, 30c or the word line 33a, 33b, 33c and is electrically insulated from the channel region 32 and the electrically conductive regions 31a, 31b within the semiconductor layer 12 by a thin gate insulator layer (not illustrated here). Each word line 33a, 33b, 33c is electrically insulated laterally and toward the top by an insulation encapsulation 34.

The regions between the insulation encapsulations 34 of the word lines 33a, 33b, 33c are essentially completely filled with a first insulator layer 13 in the first process stage shown in FIG. 1A. In the exemplary embodiment illustrated here, the two memory cells 15b, 15c are connected to a bit line 35 via a common bit line contact 35a.

A strap contact-trench insulation arrangement according to the invention is fabricated between the two memory cells 15a, 15b by means of the process steps explained below. In order to protect the bit line contact 35a, between the memory cells 15b, 15c, as is shown in FIG. 1A, a protective layer 14 is applied on the insulator layer 13 and the insulation encapsulations 34 of the word lines 33a, 33b, 33c, which protective layer is patterned with the aid of a photolithographic step in such a way that a strip-type structure is formed in the direction of the word lines 33a, 33b, 33c, the layer strips covering the region between the word lines 33b, 33c, while the region between the word lines 33a, 33b is uncovered. The strip-type protective layer 14 preferably has a high resistance with respect to the eroding methods of the subsequent process steps and serves as a selection mask during the fabrication of the strap contact-trench insulation arrangement according to the invention.

Figure 1B:
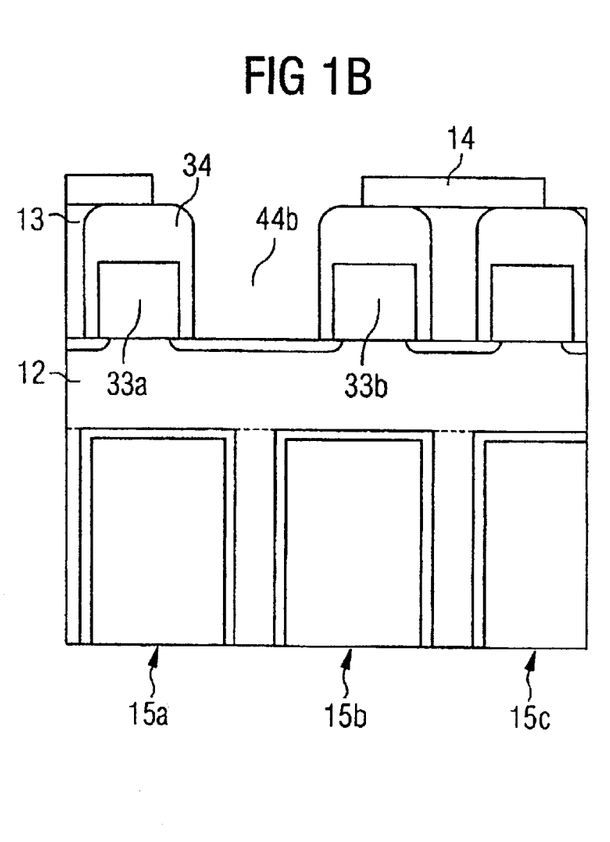
Figure 3:
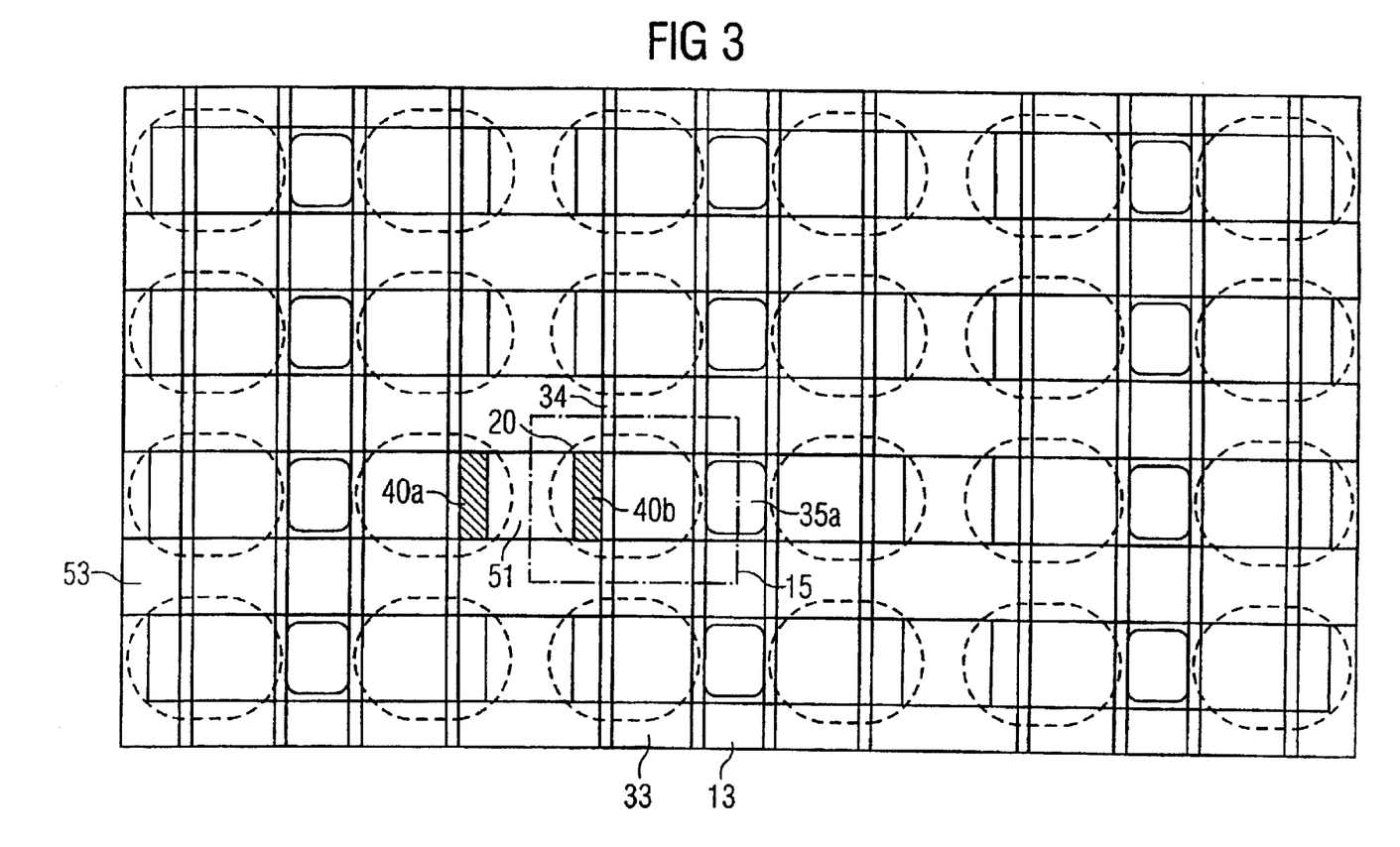
FIG. 3 shows a plan view of a memory cell arrangement according to the invention.

In a further process step, an opening 44b is fabricated between the memory cells 15a, 15b, which opening is referred to as a spacer trench hereinafter. As is shown in FIG. 1B, for this purpose the insulator layer 13 is removed between the insulation encapsulations 34 of the word lines 33a, 33b down to the semiconductor layer 12, preferably by means of an anisotropic etching method. Since the interspace between the memory cells 15b, 15c is covered by the strip-type protective layer 14, this process step is advantageously effected without a further lithographic mask step, the strip-type protective layer 14 and the insulation encapsulations 34 of the word lines 33a, 33b serving as an etching mask. In this case, as is shown in FIG. 3, spacer trenches 44b running along the insulation encapsulations 34 of the word lines 33a, 33b are formed.

Figure 1C:
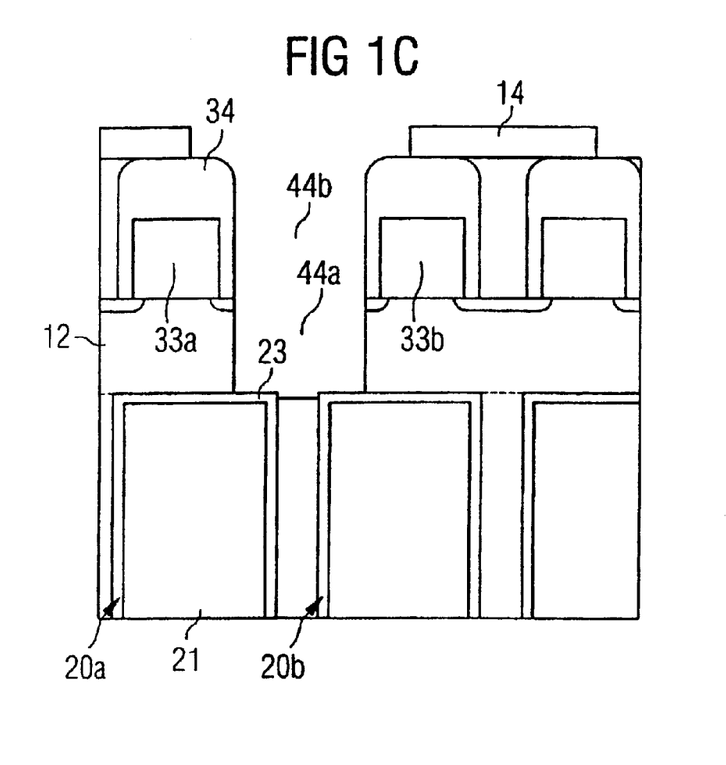

In the next process step, in the spacer trench 44b, in a region between the insulation encapsulations 34 of the word lines 33a, 33b and the insulation structures in the bit line direction 53, a contact opening 44a is then formed in the semiconductor layer 12 down to the insulation covering layers 23 of the polycrystalline trench filling 21 of the trench capacitors 20a, 20b. For this purpose, as shown in FIG. 1C, the semiconductor layer 12 is etched selectively, preferably by means of an anisotropic etching method, the strip-type protective layer 14, the insulation encapsulations 34 of the word lines 33a, 33b and the insulation structures 53 formed in the semiconductor layer 12 serving as etching mask during this etching step.

Figure 1D:
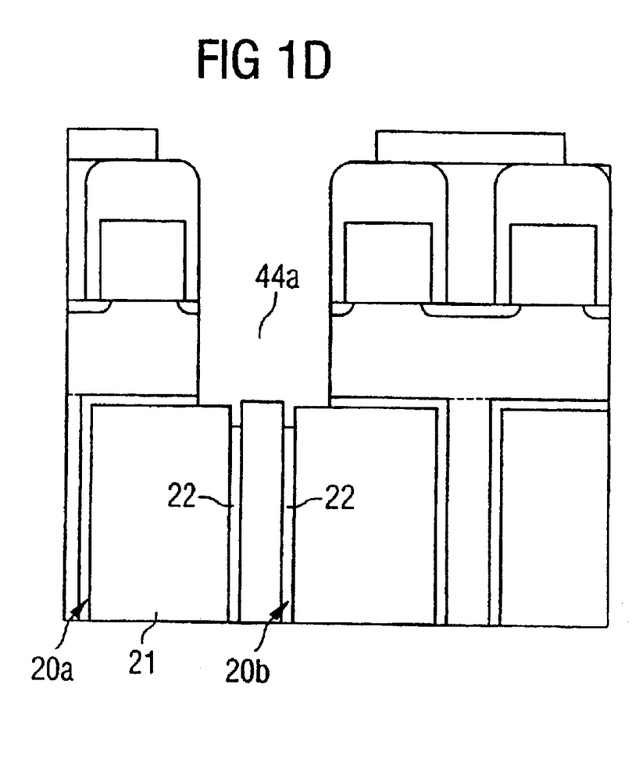

FIG. 1D shows a further process step, which produces the access to the polycrystalline trench fillings 21 of the trench capacitors 20a, 20b, in the contract opening 44a. For this purpose, the uncovered partial regions of the insulation encapsulations 22 and of the insulation covering layers 23 of the trench capacitors 20a, 20b are removed by means of a selective etching method, thereby uncovering the underlying partial regions of the respective trench filling 21.

Figure 1E:
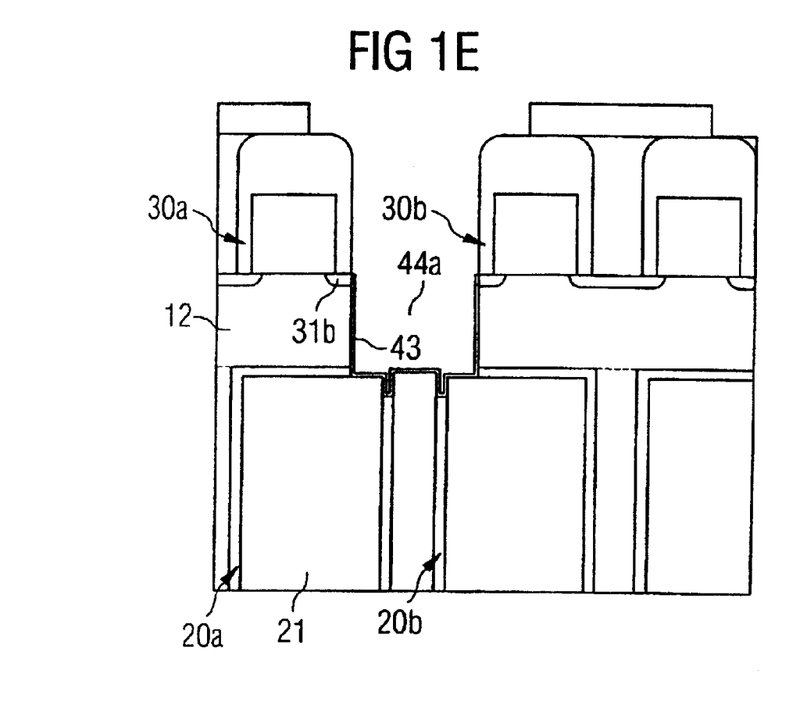

In FIG. 1E, a thin insulator layer 43 is formed in the contact opening 44a on the uncovered sidewalls of the semiconductor layer 12, the electrically conductive regions 31b of the selection transistors 30a, 30b, the polycrystalline trench filling 21 of the trench capacitors 20a, 20b and also the upper uncovered regions of the web 11 of the semiconductor substrate 10 between the trench capacitors 20a, 20b, which insulator layer is preferably fabricated by means of CVD deposition (chemical vapor deposition) or oxidation.

Figure 1F:
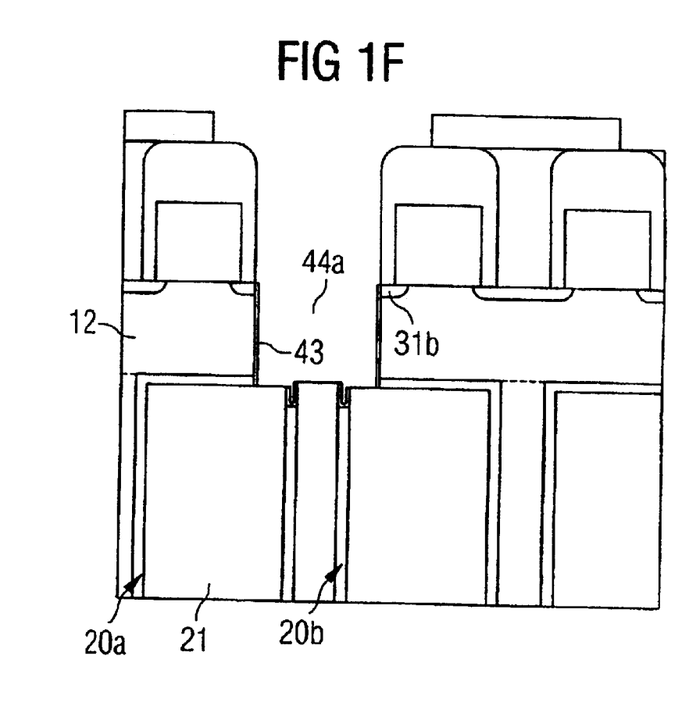

In FIG. 1F, the thin insulator layer 43 produced in the contact opening 44a is removed again by means of an anisotropic etching step, except for the regions on the steep sidewalls of the contact opening 44a. The remaining regions of the insulator layer 43 serve, in the memory cell arrangement, as an electrical insulation of the subsequently formed strap contacts 40a, 40b from the semiconductor layer 12 and thus reduces leakage currents which [lacuna] to the discharge of the trench capacitors 20a, 20b and to the shortening of the retention time, the maximum period of time after which the charge stored in a memory cell 15 must be refreshed.

Figure 1G:
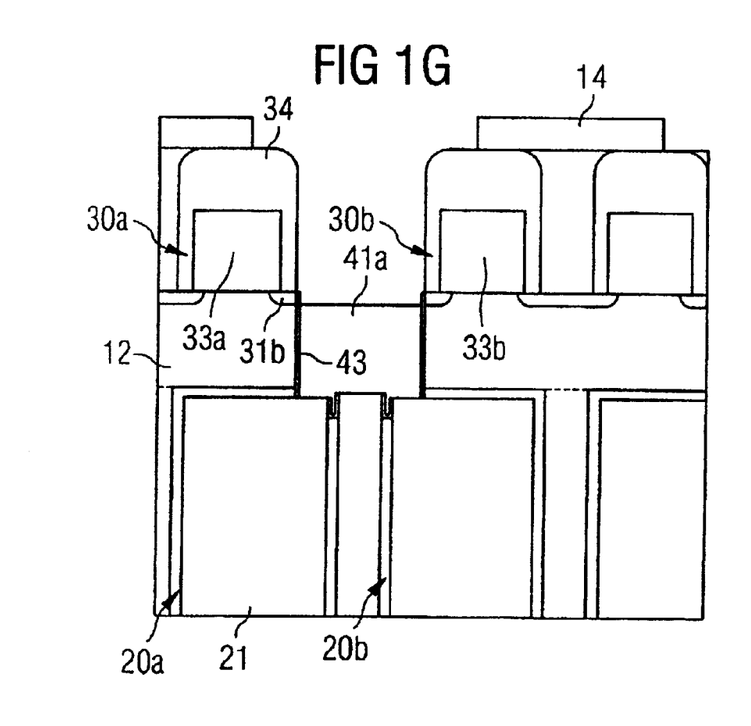

In the subsequent step, as shown in FIG. 1G, a first electrically conductive layer 41a is deposited in the contact opening 44a, which layer is preferably composed of doped polysilicon and is referred to as first contact layer hereinafter.

Figure 1H:
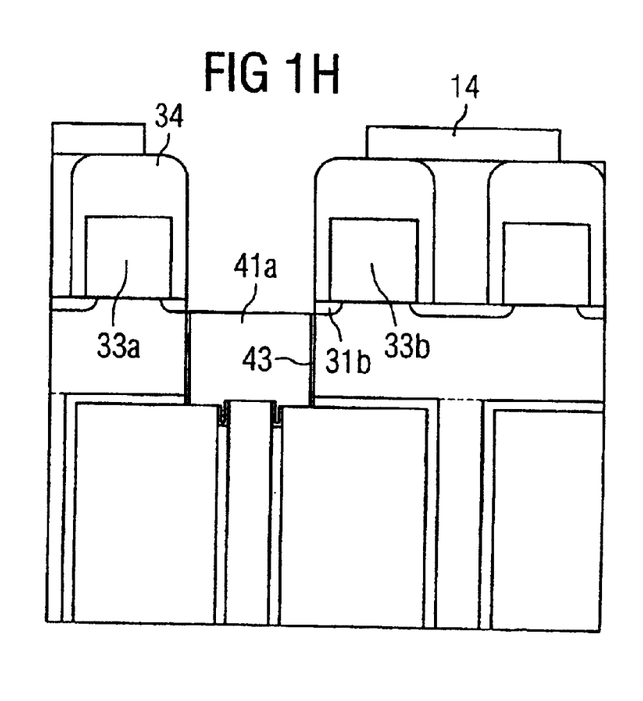

For the contact-connection of the selection transistors 30a, 30b, in the subsequent process step, the partial regions of the insulator layer 43 covering the electrically conductive regions 31b of the selection transistors 30a, 30b are removed. For this purpose, firstly the first contact layer 41a is removed again as far as a level just below the surface of the semiconductor layer 12, by means of a planarizing etching method. Afterward, the uncovered partial regions of the insulator layer 43 are removed with the aid of an isotropic etching method until the electrically conductive regions 31b of the selection transistors 30a, 30b are uncovered. In this case, as illustrated in FIG. 1H, the first contact layer 41a in the contact opening 44a, the insulation encapsulations 34 of the word lines 33a, 33b and the strip-type protective layer 14 serve as etching mask.

Figure 1I:
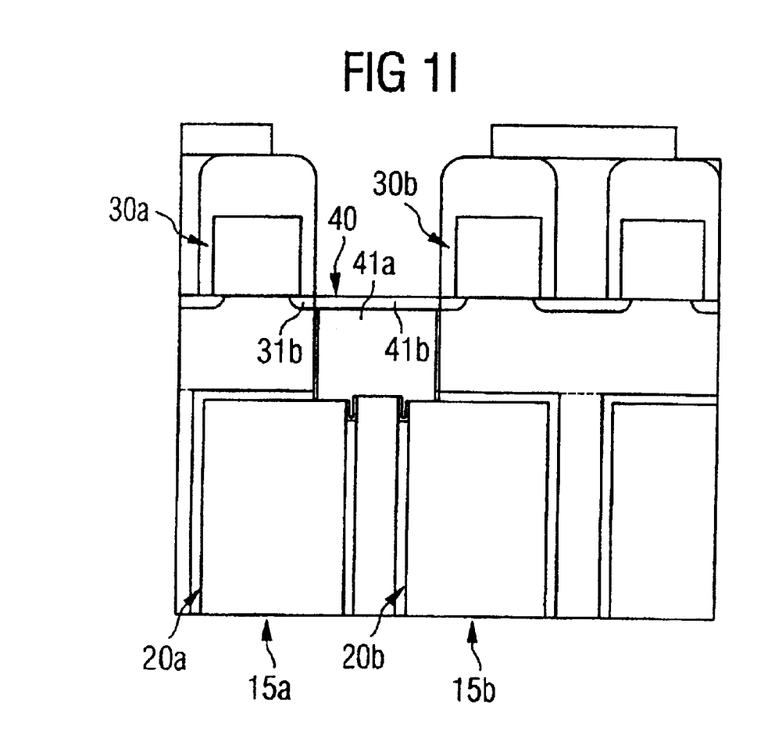

As shown in FIG. 1I, in the subsequent process step for contact-connection of the selection transistors 30a, 30b, a second electrically conductive layer 41b which is preferably composed of doped polysilicon and is referred to as second contact layer hereinafter is deposited onto the first contact layer 41a in the contact opening 44a as far as a level preferably just above the electrically conductive regions 31b of the selection transistors 30a, 30b, so that the contact block 40 comprising the two contact layers 41a, 41b in the contact opening 44a forms an electrically conductive connection between the selection transistors 30a, 30b and the trench capacitors 20a, 20b.

In order, however, to enable each of the memory cells 15a, 15b to be individually charged or discharged, separation of the contact block 40 in the contact opening 44a is performed in a further process step. At the same time, this produces an insulation structure 52 between the two memory cells 15a, 15b.

Figure 1J:
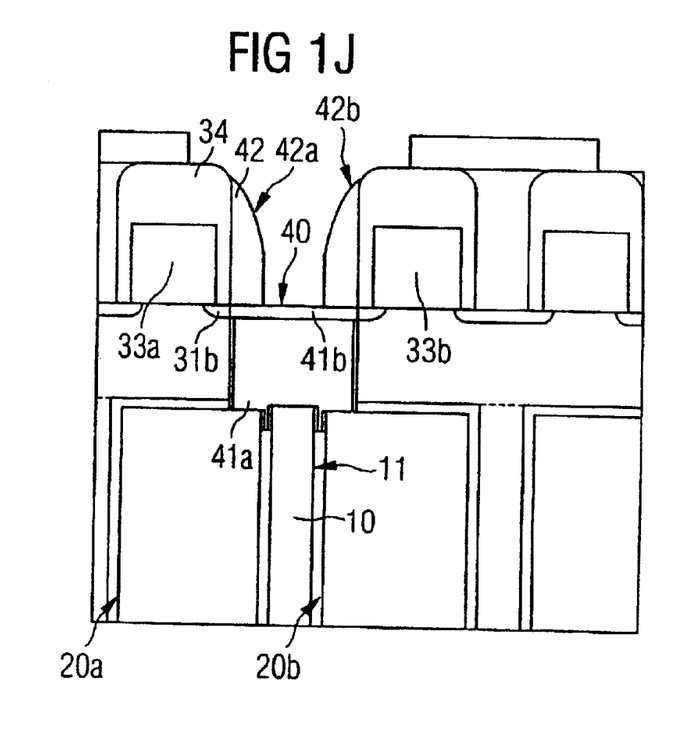

As shown in FIG. 1J, for this purpose firstly an etching mask is produced for the etching of the contact block 40 in the contact opening 44a. In this case, an insulator layer designated as spacer layer 42 is deposited onto the contact layers 41a, 41b and the uncovered regions of the insulation structures 53, running in the bit line direction, in the spacer trench 44b, thereby filling the interspace between the insulation encapsulations 34 of the word lines 33a, 33b along the word line direction with the spacer layer 42. The thickness of this spacer layer 42 is configured in a manner dependent on the process and is approximately equal to the width of the spacer trench 44b in the exemplary embodiment illustrated. Afterward, the spacer layer 42 is etched away down to the underlying contact block 40 with the aid of an anisotropic etching method. Since the horizontal and the vertical regions of the spacer layer 42 have different rates of removal during the anisotropic etching, the spacer layer 42 is divided completely into two partial regions 42a, 42b, which are referred to as spacers hereinafter.

The insulation opening 50b produced in this case exhibits the funnel-shaped etching profile illustrated in FIG. 1J, the opening 50b in the spacer layer 42 tapering increasingly with depth, so that it has the smallest width in the bottommost region, directly on the contact block 40. In the exemplary embodiment illustrated here, the insulation opening 50b has, in the bottommost region of the spacer layer 42, approximately the width of the underlying web 11, which separates the trench capacitors 20a, 20b from one another, in the semiconductor substrate 10. In order to ensure that the area of the memory cell arrangement is utilized as efficiently as possible, the insulation opening 50b is generally produced such that it is as narrow as possible. In this case, the dependence of this width on the etching depth is advantageously utilized, as a result of which the width of the insulation opening 50b can be set very precisely by means of the thickness of the deposited spacer layer 42 in the interspace between the word lines 33a, 33b. Thus, with the aid of this method, it is possible to fabricate insulation openings 50b whose width is narrower than the minimum possible lithographic web width.

Figure 1K:
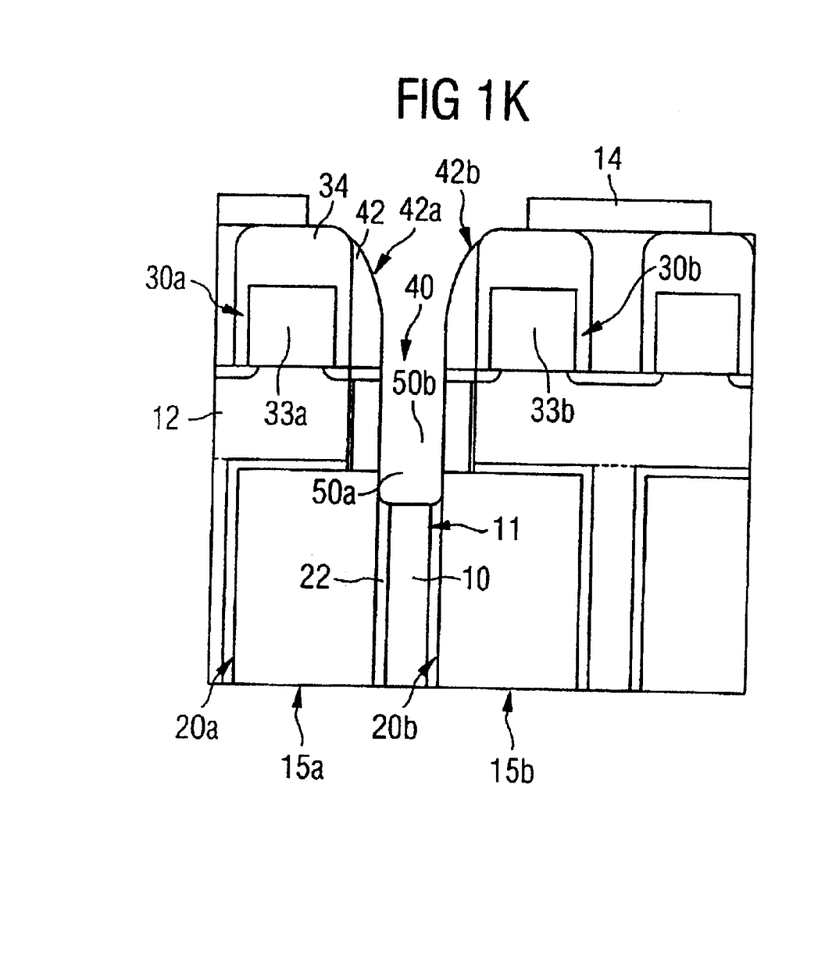

In a subsequent process step, the insulation opening 50b of the spacer layer 42 in the contact block 40 is extended right into the semiconductor substrate 10. In this case, the spacers 42a, 42b, the uncovered partial regions of the insulation encapsulations 34 of the word lines 33a, 33b, the strip-type protective layer 14 and the insulation structures 53, oriented in the bit line direction, in the semiconductor layer 12 serve as etching mask, so that only the region of the contact block 40 which is situated below the insulation opening 50b and between the memory cells 15a, 15b is selectively removed with the aid of an anisotropic etching method. In this process step, as is shown in FIG. 1K, a partial region of the web 11 of the semiconductor substrate 10 and also partial regions of the insulation encapsulations 22 of the trench capacitors 20a, 20b are also concomitantly removed, so that the insulation 30 opening 50a thus produced completely separates the contact block 40 in the contact opening 44a and each of the selection transistors 30a, 30b is electrically connected only to the trench capacitor 20a, 20b of the respective memory cell 15a, 15b.

In a modified embodiment, the insulation opening 50a is formed in trench form along the entire length of the spacers 42a, 42b. In this case, in addition to the contact blocks 40, the insulation structures 53 formed in the semiconductor layer 12 in the bit line direction are also removed with the aid of a selective etching method to a point below the substrate surface.

Figure 1L:
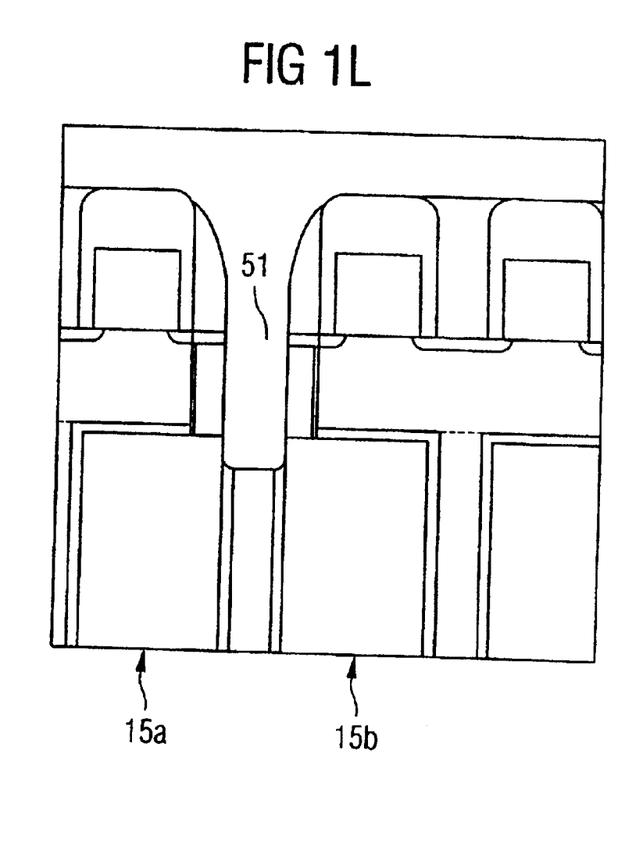

In a subsequent process step, the insulation trench 50 formed by the insulation openings 50a, 50b is filled with a further insulator 51, as a result of which the two memory cells 15a, 15b are electrically insulated from one another, as shown in FIG. 1L.

Figure 2:
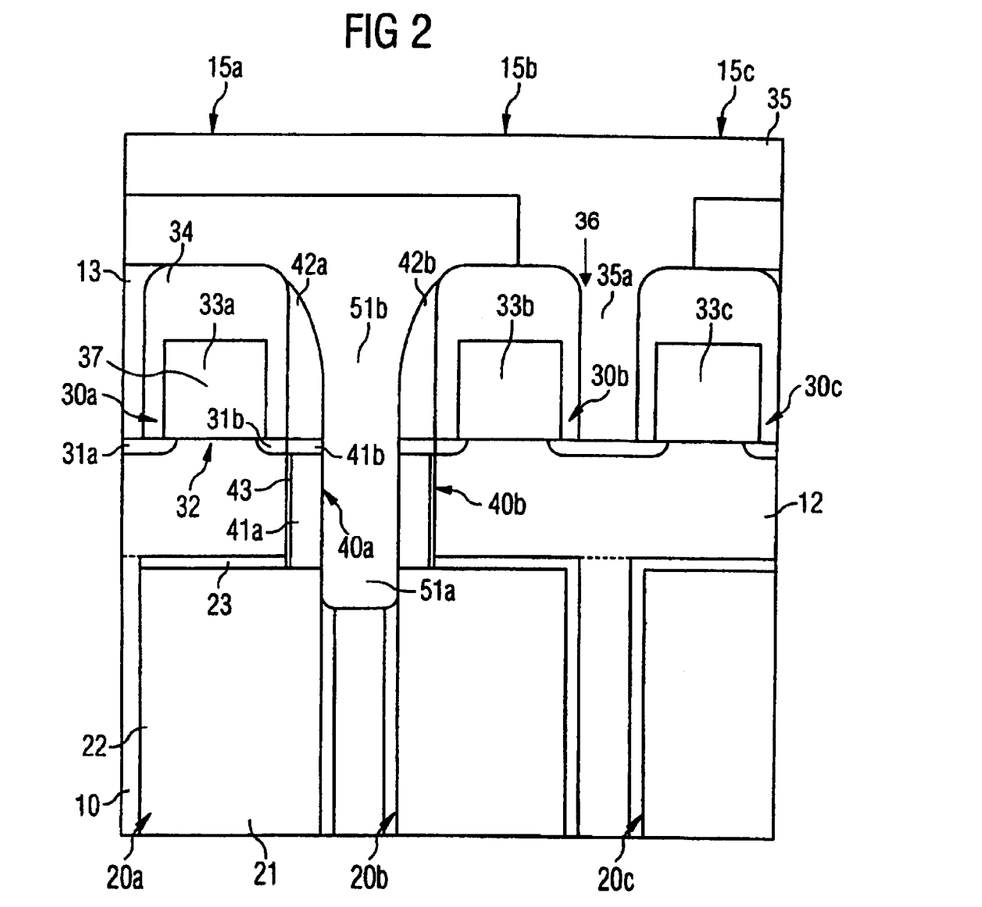
FIG. 2 shows a cross section through a region of a memory cell arrangement according to the invention which has been produced by means of the process sequence illustrated in FIGS. 1A to 1F.

FIG. 2 shows a cross section through the semiconductor wafer with the three memory cells 15a, 15b, 15c after further process steps for the fabrication of a bit line contact 35a. For this purpose, a contact opening 36 down to the electrically conductive region 31a of the two selection transistors 30b, 30c is formed in the interspace between the insulation encapsulations 34 of the word lines 33b, 33c. The contact opening 36 of the bit line contact 35a is filled with an electrically conductive material and connects the common source/drain electrode 31a of the selection transistors 30a, 30b of the two memory cells 15b, 15c to the bit line 35, which, in the exemplary embodiment illustrated, is arranged at a right angle to the word lines 33a, 33b, 33c above the insulator layer 51b isolating the strap contacts 40a, 40b from the bit line 35.

FIG. 3 shows a layout of a memory cell arrangement according to the invention with a total of 24 memory cells 15, which are arranged in four rows and six columns, three memory cells 15 of a row in each case being formed in a manner corresponding to the memory cells 15a, 15b, 15c according to FIG. 2.

In this case, the memory cells 15 have an arrangement of trench capacitors 20, which are illustrated by an interrupted line, and selection transistors 30, which are essentially formed above the trench capacitors 20 and whose gate electrodes 37 simultaneously form the common word line 33 of the respective column of the memory cell arrangement. The monocrystalline semiconductor layer 12 which, as is shown in FIG. 2, is formed between the trench capacitors 20 and the selection transistors 30 is subdivided in strip form in the bit line direction by insulation trenches 53 which preferably extend right into the semiconductor substrate. These insulation trenches 53, which run horizontally in FIG. 3, form the field insulation in the word line direction between the memory cells 15.

The memory cells 15 of the memory cell arrangement are situated in the crossover regions of the word lines 33 and bit lines 35, which are arranged perpendicularly to one another, the bit lines 35, not illustrated in FIG. 3 for the sake of clarity, running horizontally and the word lines 33 running vertically.

As shown in FIG. 3, memory cells 15 arranged in a row of the memory cell arrangement alternately have in their interspaces a common bit line contact 35a and a strap contact-trench insulation arrangement according to the invention. The interspace between the word lines 33, in which a bit line contact 35a is formed, is preferably smaller than the double strap contact-trench insulation arrangement according to the invention, so that the word lines 33, as shown in FIG. 3, are arranged offset with respect to one another in pairs.

Each bit line contact 35a comprises a conductive layer which is formed in a contact opening 36 between the word lines 33 of two memory cells 15, and contact-connects the electrically conductive regions 31a of the respective selection transistors 30.

The strap contact-trench insulation arrangements according to the invention are formed in the wider interspaces of the word lines 33 in each case between two memory cells 15. For this purpose, between the memory cells 15 which are adjacent in the bit line direction, a contact opening 44a is in each case formed in the semiconductor layer 12, which is bounded by the insulation structures 53 in the word line direction, the contact opening 44a extending as far as the polycrystalline trench filling 21 of the respective trench capacitors 20. A contact block 40 is formed within the contact opening 44a, which contact block comprises a first contact layer 41a, which reaches as far as the lower level of the electrically conductive regions 31b in the semiconductor layer 12, and a second contact layer 41b, which reaches as far as the upper level of these regions 31b.

The central region of each contact block 40 of the memory cell arrangement is provided with an insulation opening 50a, which is filled with an insulator layer 51a. In this case, the insulation opening 50a reaches to a point below the upper edge of the insulation covering layers 23 and is bounded by the insulation structures 53 in the word line direction, so that the contact block 40 is separated into two mutually independent strap contacts 40a, 40b, which in each case electrically connect only the storage capacitor 20 to the selection transistor 30 of the respective memory cell 15.

The region bounded by the word lines 33 above the strap contacts 40a, 40b, the insulation openings 50a and the insulation structures 53 arranged in the bit line direction has a further insulator layer. As can be seen from the cross section in FIG. 1L and FIG. 2, this insulator layer in each case comprises an insulator layer 51b and two spacers 42a, 42b, each spacer 42a, 42b being formed above the respective strap contacts 40a, 40b along each word line 33 and the insulator layer 51b filling the insulation opening 50b, separating the spacers 42a, 42b, to a point above the insulation encapsulations 34 of the word lines 33.

The insulator layer 51a forms the field insulation structure of the memory cell matrix perpendicular to the bit line direction, and, together with the field insulation trenches 53 oriented in the bit line direction, the complete insulation matrix of the memory cell arrangement.

What is claimed is:

1. A memory cell configuration, comprising:

a semiconductor substrate;

a semiconductor layer configured on said semiconductor substrate, said semiconductor layer having a surface;

a plurality of memory cells configured in a matrix, each one of said plurality of said memory cells including a trench capacitor and a selection transistor, said trench capacitor being formed in said semiconductor substrate and including an electrically conductive trench filling;

said selection transistor being formed in said surface of said semiconductor layer above maid trench capacitor and including two electrically conductive regions in said semiconductor layer, and a channel region separating two electrically conductive regions;

said channel region being formed substantially above said trench capacitor;

said selection transistor further including an electrically conductive layer insulated from said two electrically conductive regions and said channel region and being disposed on said semiconductor layer above said channel region;

a plurality of substantially parallel bit lines and a plurality of substantially parallel word line formed by said electrically conductive layer of said each of said plurality of said memory cells, said plurality of said word lines being configured substantially perpendicular to said plurality of said bit lines for defining crossover points between said plurality of said bit lines and said plurality of said word lines, said plurality of said memory cells being configured at said crossover points;

said plurality of said memory cells having three memory cells configured along one of said plurality of said bit lines, said three memory cells including sequentially a first, a second, and a third memory cell, each of said three memory cells being contact-connected by said electrically conductive layer by a respective one of said plurality of said word line, said plurality of word lines having three word lines being contact-connected to said three memory cells sequentially by said first, said second, and said third memory cell, said one of said plurality of said bit lines having a given region between a first of said word lines and a second of said word lines, said given region contact-connecting one of said two electrically conductive regions of said selection transistor of said first and second memory cells;

a contact block formed in said semiconductor layer in a region between said second of said three word lines and a third of said three word lines;

said contact block including a contact opening having a first insulator layer, a second insulator layer, a first laterally configured electrically conductive layer and a second laterally configured electrically conductive layer, said contact block being formed below said one of said plurality of said bit lines and being electrically isolated from said one of said plurality of said bit lines by said second insulator layer, said first laterally configured electrically conductive layer contact-connecting said trench filling of trench capacitor of said second memory cell with another one of said two electrically conductive region of said selection transistor of said second memory cell, said second laterally configured electrically conductive layer contact-connecting said trench filling of said trench capacitor of said third memory cell with another one of said two electrically conductive regions of said selection transistor of said third memory cell; and said first insulator layer being formed between said first laterally configured electrically conductive layer and said second laterally configured electrically conductive layer;

said contact opening extending into said semiconductor substrate into a region disposed between said trench capacitor of said second memory cell and said trench capacitor of said third memory cell; and said contact opening having a width substantially corresponding to a distance between said trench capacitor of said one of said two memory cells and said trench capacitor of said further memory cell.

2. The memory cell configuration according to claim 1, comprising:

a spacer insulation layer formed above maid first laterally configured electrically conductive layer and said second laterally configured electrically conductive layer of said contact block;

said spacer insulation layer located between said word lines associated with said second memory cell and said third memory cell.

3. The memory cell configuration according to claim 1, wherein said first insulator layer and said second insulator layer are embodied as a continuous layer.

4. The memory cell configuration according to claim 1, comprising:

an insulator layer formed between said first laterally configured electrically conductive layer of said contact block and said semiconductor layer;

said insulator layer also formed between said second laterally configured electrically conductive layer of said contact and said semiconductor layer; and said insulator layer located below said two electrically conductive region in said semiconductor layer.

* * * * *